(12) United States Patent
Walkup et al.

(10) Patent No.: US 6,908,313 B2
(45) Date of Patent: Jun. 21, 2005

(54) ELECTRICAL SOCKET HAVING TERMINALS WITH ELONGATED MATING BEAMS

(75) Inventors: William B. Walkup, Hillsboro, OR (US); Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/964,457

(22) Filed: Oct. 12, 2004

(65) Prior Publication Data

US 2005/0037637 A1 Feb. 17, 2005

Related U.S. Application Data

(63) Continuation of application No. 10/625,237, filed on Jul. 22, 2003, now Pat. No. 6,805,561.

(51) Int. Cl.⁷ .............................................. H01R 12/00
(52) U.S. Cl. ......................................................... 439/66
(58) Field of Search ........................... 439/66, 607, 408, 439/591, 862, 71, 541.5

(56) References Cited

U.S. PATENT DOCUMENTS

| | | | | |
|---|---|---|---|---|
| 4,715,820 A | * | 12/1987 | Andrews et al. ............... | 439/59 |
| 6,139,377 A | * | 10/2000 | Chen ........................... | 439/885 |
| 6,171,134 B1 | * | 1/2001 | Lai ............................. | 439/405 |
| 6,186,797 B1 | * | 2/2001 | Wang et al. .................. | 439/66 |
| 6,193,554 B1 | * | 2/2001 | Wu ............................. | 439/607 |
| 6,203,335 B1 | * | 3/2001 | Chang ......................... | 439/79 |
| 6,217,388 B1 | * | 4/2001 | Francis ....................... | 439/620 |
| 6,805,561 B1 | * | 10/2004 | Walkup et al. ................ | 439/66 |

* cited by examiner

Primary Examiner—J. F. Duverne
(74) Attorney, Agent, or Firm—Wei Te Chung

(57) ABSTRACT

An electrical socket for interconnecting an LGA chip with a PCB includes an insulative housing (2) and a multiplicity of terminals (1). The housing includes a plurality of passageways (26) extending therethrough for engagingly accommodating corresponding terminals. Each terminal includes a locating plate (10) arranged in rows, and a mating beam (12) connected to the locating plate and extending along the corresponding row. The terminals and the mating beams are arranged so that a projection A of each mating beam along the corresponding row is longer than a distance B between each two adjacent locating plates of two adjacent terminals arranged in the same row. Accordingly, when the mating beams are engaged with electrodes of the LGA chip, the mating beams are long enough to provide excellent resilient deflection characteristics, thereby ensuring good mechanical and electrical connection between the mating beams and the electrodes.

17 Claims, 6 Drawing Sheets

ELECTRICAL SOCKET HAVING TERMINALS WITH ELONGATED MATING BEAMS

This application is a continuation application of the application Ser. No. 10/625,237 filed Jul. 22, 2003 U.S. Pat. No. 6,805,561.

BACKGROUND OF THE INVENTION

1. Field of the Invention

The present invention relates to electrical sockets, and particularly to an electrical socket having terminals with resilient mating beams.

2. Description of the Prior Art

With the trend toward miniaturization in computer technology, land grid array (LGA) electrical sockets are becoming smaller and smaller. The LGA socket mainly comprises an insulative housing and a multiplicity of terminals. Due to the small size of the terminals, mating beams thereof are easily damaged because of large stress produced therein when the terminals are engaged with electrodes of a complementary electronic package such as a central processing unit (CPU). Several solutions have been developed to overcome this problem. One solution is disclosed in U.S. Pat. Nos. 6,315,576 and 6,290,507. The structure of the terminals is modified so as to obtain optimal electrical and mechanical performance of the mating beams of the terminals. Another solution is disclosed in U.S. Pat. Nos. 6,186, 797 and 6,132,220. The arrangement of the terminals with respect to a base of an insulative housing of the socket is modified. In an electrical socket as disclosed in U.S. Pat. No. 6,186,797, a base plate of the socket defines an array of terminal holes arranged in a lattice-like array for receiving corresponding terminals therein. Respective rows of the terminal holes are oriented at a same angle, preferably 45 degrees, with respect to sides of the base plate. In this way, not only is miniaturization of the pitch of adjacent terminals enhanced, but also the performance of the terminals is improved. However, the terminals cannot be fitted into the lattice-shaped terminal holes of the base plate simultaneously, due to the limitations of existing manufacturing technology for the terminals. Thus assembly of the terminals is unduly complicated. Furthermore, in forming the terminal holes oriented at 45 degrees, core pins of the base plate mold also need to be oriented at 45 degrees. This complicates formation of the base plate mold.

Therefore, it would be very beneficial to provide an electrical socket having terminals which reliably electrically connect with electrodes of an electronic package, and which allows easy assembly of the terminals into terminal holes of the electrical socket.

SUMMARY OF THE INVENTION

Accordingly, a main object of the present invention is to provide an electrical socket having conductive terminals, wherein the terminals enhance the performance of the socket while still maintaining a high density array in the socket.

To fulfill the above-mentioned object, an electrical socket for connecting an LGA chip with a PCB is provided by the present invention. In a preferred embodiment, the electrical socket includes an insulative housing having a plurality of passageways extending therethrough, and a plurality of terminals assembled in the corresponding passageways of the housing. Each terminal includes a locating plate arranged in rows, and a mating beam connected to the locating plate and extending along the corresponding row. The terminals and the mating beams are arranged so that a projection of each mating beam along the corresponding row is longer than a distance between each two adjacent locating plates of two adjacent terminals arranged in the same row. Accordingly, when the mating beams are engaged with electrodes of the LGA chip, the mating beams are long enough to provide excellent resilient deflection characteristics, thereby ensuring good mechanical and electrical connection between the mating beams and the electrodes.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 8:
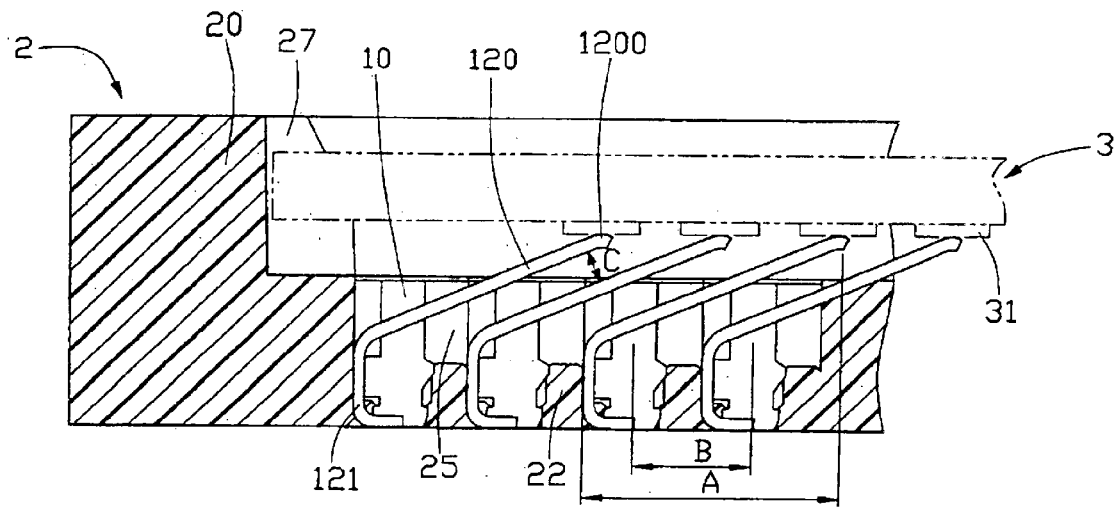
FIG. 8 is a front elevation cut-away view of part of the LGA electrical socket in accordance with the present invention, together with a corresponding part of an LGA chip in an initial position loosely engaged on the LGA electrical socket.

Referring to FIGS. 1 to 4, an LGA electrical socket in accordance with the preferred embodiment of the present invention comprises a plurality of terminals 1 stamped from a sheet of resilient metallic material. Each terminal 1 comprises a locating plate 10, a mating beam 12, and a bridging portion 11 interconnecting the locating plate 10 and the mating beam 12. The locating plate 10 connects to a carrier strip (not shown), for facilitating insertion of a row of the terminals 1 into the LGA socket. A pair of lower barbs 101 protrudes from two opposite edges of the locating plate 10 respectively. An upper barb 100 depends from one of said edges of the locating plate 10, above one of the lower barbs 101. The lower barbs 101 and the upper barb 100 are provided for fixing the terminal 1 in the LGA socket. The bridging portion 11 extends forwardly and laterally from the other of said edges of the locating plate 10. The mating beam 12 comprises an elongated upper connecting portion 120 extending laterally and upwardly from the bridging portion 11 for mechanically and electrically connecting with a corresponding electrode 31 of an LGA chip 3 (as shown in FIG. 8), and a lower connecting portion 121 depending from the bridging portion 11 for mechanically and electrically connecting with a corresponding circuit pad of a PCB (not shown). The upper connecting portion 120 comprises a mating portion 1200 at a distal end thereof, for contacting the electrode 31. The lower connecting portion 121 comprises a planar horizontal soldering base 1210 at a distal end thereof, for soldering to the circuit pad of the PCB.

Figure 1:
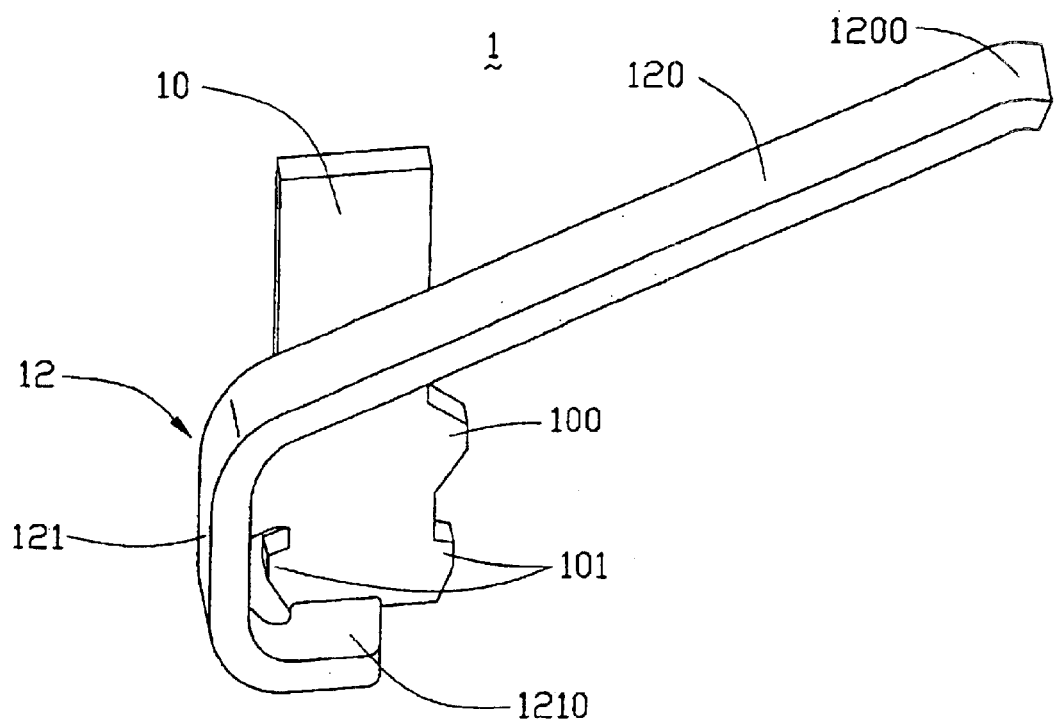
FIG. 1 is an isometric view of one terminal of an LGA electrical socket in accordance with the present invention.
Figure 2:
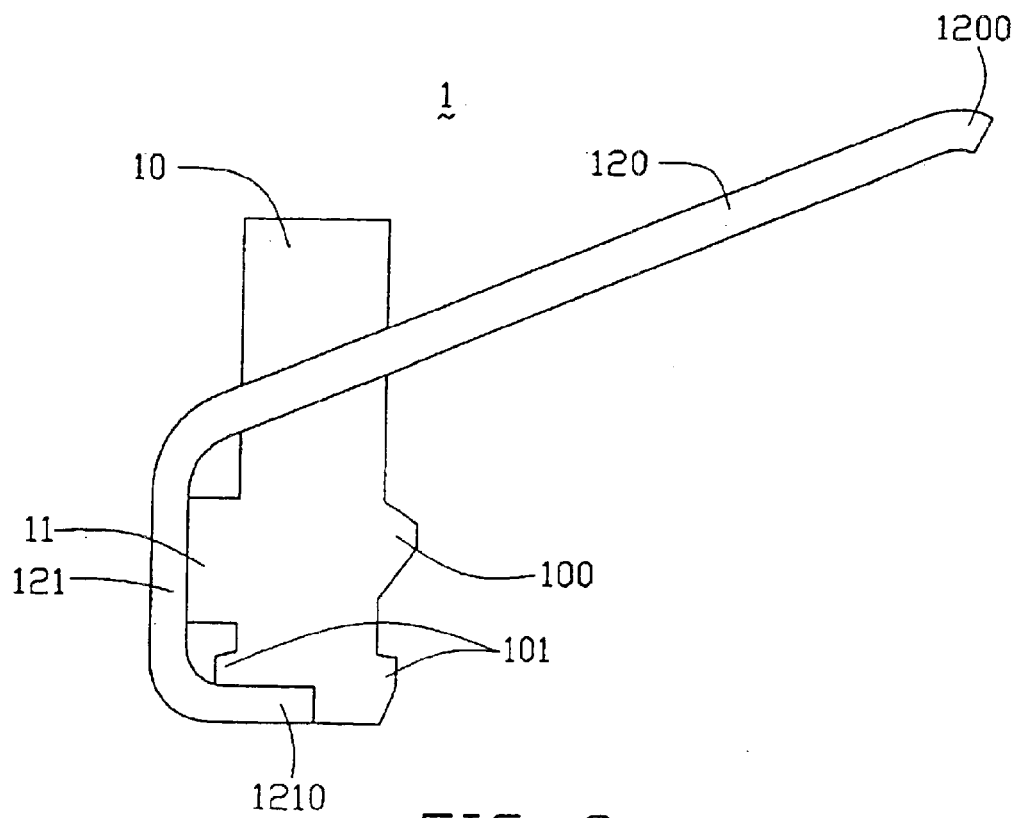
FIG. 2 is a front elevation view of the terminal of FIG. 1.
Figure 3:
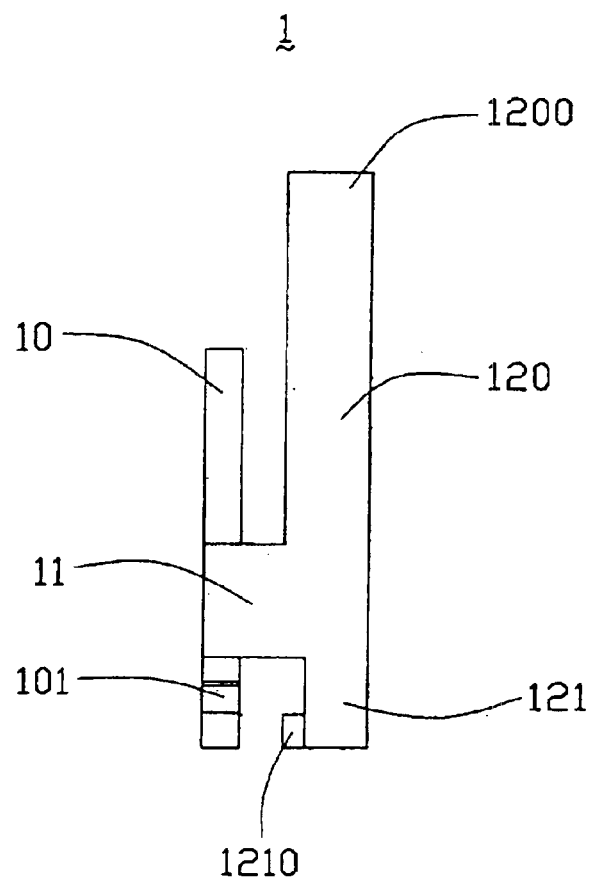
FIG. 3 is a left side elevation view of the terminal of FIG. 1.
Figure 4:
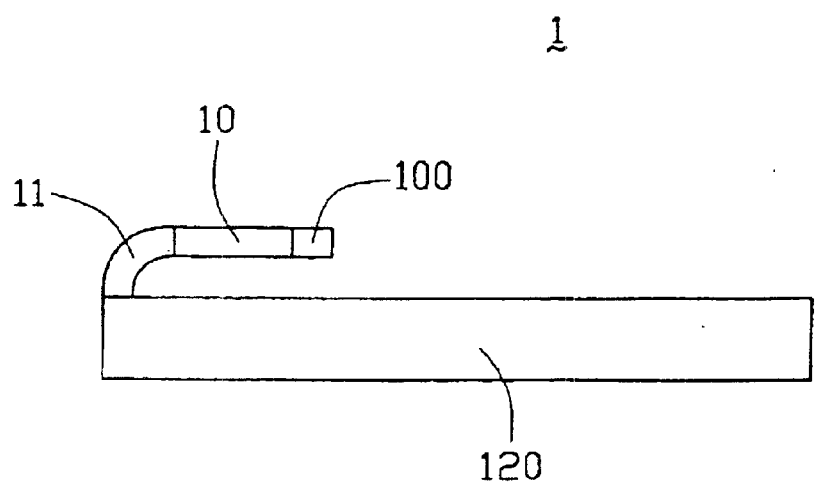
FIG. 4 is a top elevation view of the terminal of FIG. 1.
Figure 5:
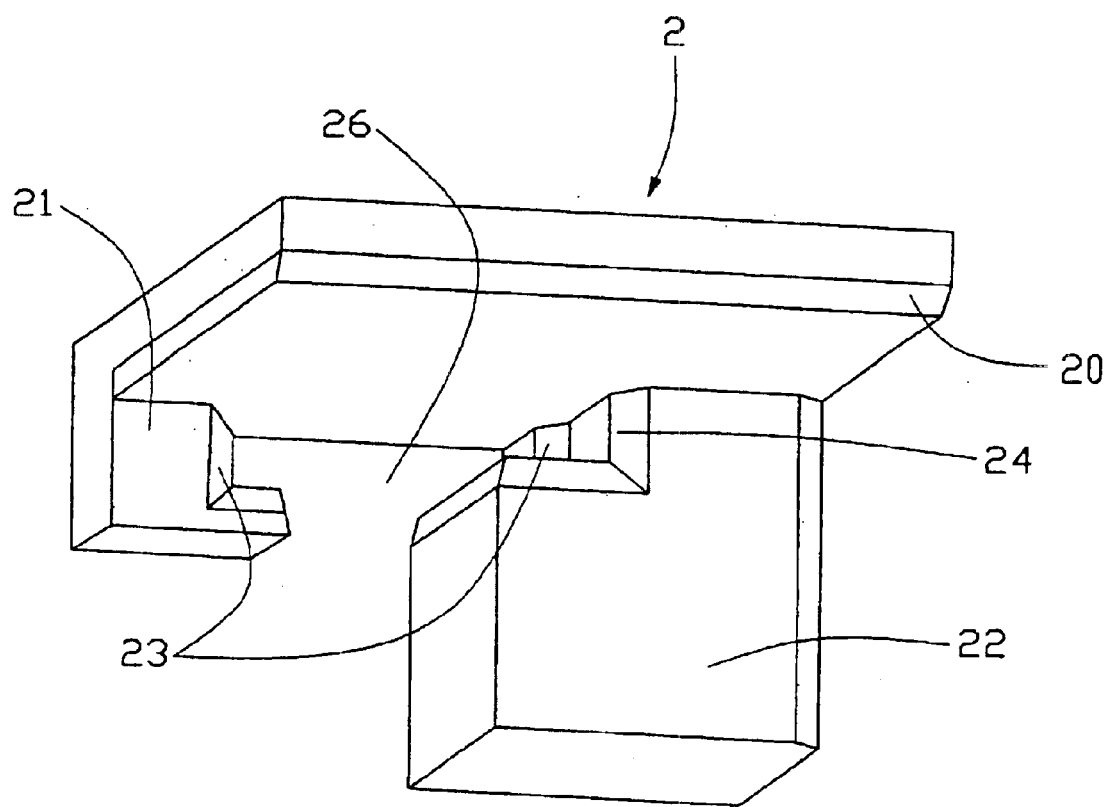
FIG. 5 is an isometric view of one terminal-receiving unit of the LGA electrical socket in accordance with the present invention, with a top of the terminal-receiving unit nearest the viewer.
Figure 6:
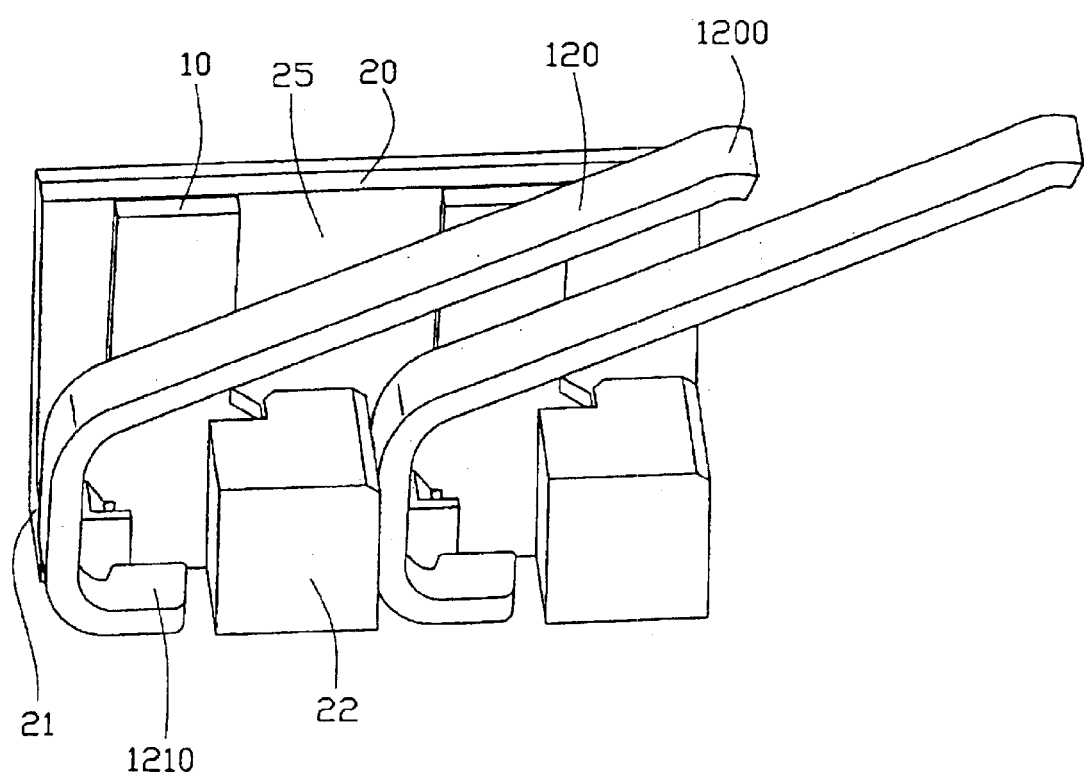
FIG. 6 is an isometric view of two adjacent terminal-receiving units and corresponding terminals of the LGA electrical socket in accordance with the present invention.
Figure 7:
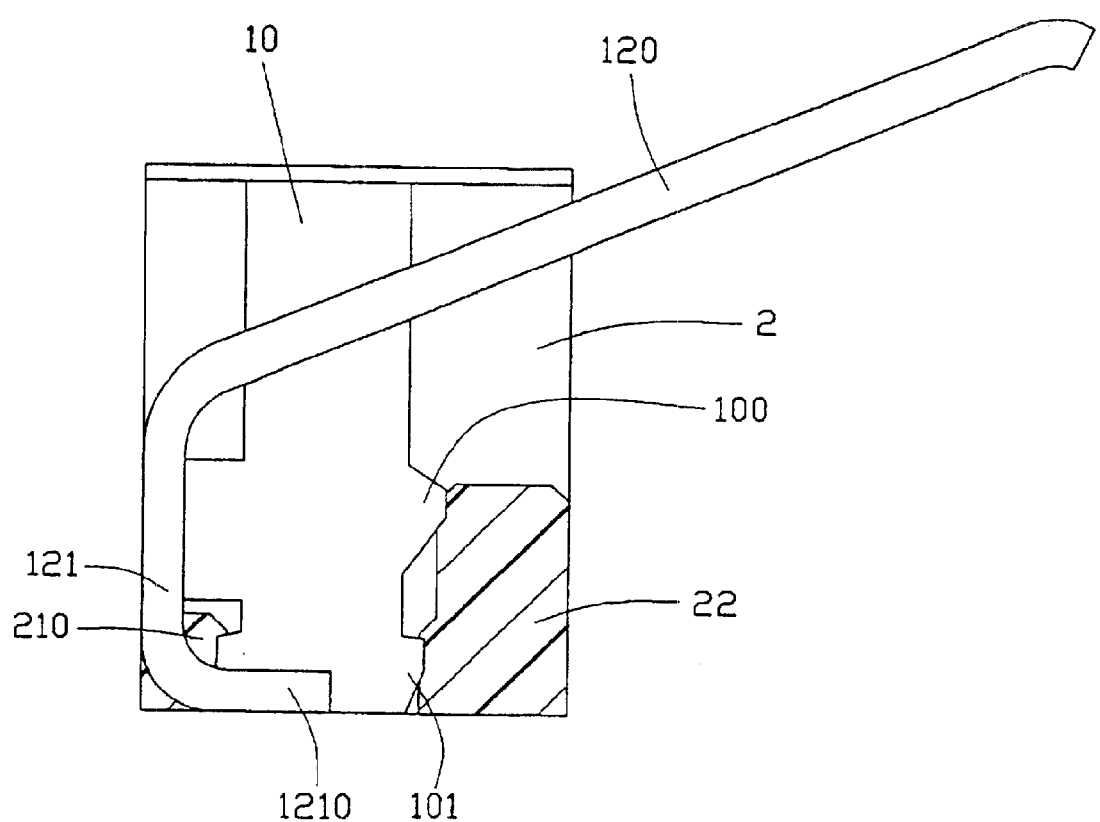
FIG. 7 is a front elevation view of part of FIG. 6, with parts of the shown terminal-receiving unit cut away.

Referring to FIG. 5, a plurality of terminal-receiving units is provided in an insulative housing 2 of the LGA socket, for accommodating corresponding terminals 1 therein. The terminal-receiving units are arranged in a regular rectangular array. Each terminal-receiving unit comprises a rear isolating wall 20, a first retaining block 21 adjoining a bottom of the isolating wall 20, and a second retaining block 22 adjoining the bottom of the isolating wall 20 and spaced apart from the first retaining block 21. A passageway 26 is thereby defined between the first and second retaining blocks 21, 22. A pair of lower retaining portions 23 is formed on the first and second retaining blocks 21, 22 respectively adjacent the passageway 26, for interferentially engaging with the lower barbs 101 of a corresponding terminal 1. An upper retaining portion 24 is formed on the second retaining block 22 above the corresponding lower retaining portion 23, for interferentially engaging with the upper barb 100 of the terminal 1.

Referring to FIGS. 6 to 9, in assembly of the LGA socket, adjacent locating plates 10 of a row of the terminals 1 are pre-connected on the carrier strip. Then the row of terminals 1 is loaded into corresponding terminal-receiving units via the carrier strip. In this way, all the terminals 1 are inserted into corresponding terminal-receiving units of the housing 2. A distance between any two adjacent locating plates 10 is a predetermined constant. A distance between any two adjacent terminal-receiving units is a predetermined constant. Therefore, a space between each two adjacent loaded terminals 1 is a predetermined constant. The terminals 1 are arranged such that the upper connecting portion 120 of each terminal 1 has a projection A along a direction of the corresponding row of terminals 1, each two adjacent locating plates 10 define a distance B therebetween, and the projection A is longer than the distance B. A space 25 is defined between each two adjacent passageways 26. The upper connecting portion 120 of each terminal 1 extends through one space 25 and further extends above a second adjacent space 25, such that the upper connecting portion 120 of each terminal 1 is spaced apart from but disposed above the mating beam 12 of an adjacent terminal 1. The upper connecting portions 120 of the terminals 1 are parallel to each other in the same row of terminals 1, and the mating portion 1200 of each upper connecting portion 120 is disposed above the lower connecting portion 121 of a terminal 1 located two places away in the row. Accordingly, when the terminals 1 are engaged with electrodes 31 of the LGA chip 3, the upper connecting portions 120 are long enough to provide excellent resilient deflection characteristics, thereby ensuring good mechanical and electrical connection between the mating beams 12 and the electrodes 31.

Referring particularly to FIG. 8, in use of the LGA socket, the LGA chip 3 is placed in an initial position. In the initial position, the LGA chip 3 is disposed in a receiving cavity 27 of the housing 2 of the LGA socket. The mating portions 1200 of the terminals 1 loosely contact the corresponding electrodes 31 of the LGA chip 3 respectively. The upper connecting portions 120 are substantially parallel to each other, and resiliently support the LGA chip 3 thereon. A distance C is defined between each two adjacent upper connecting portions 120.

Figure 9:
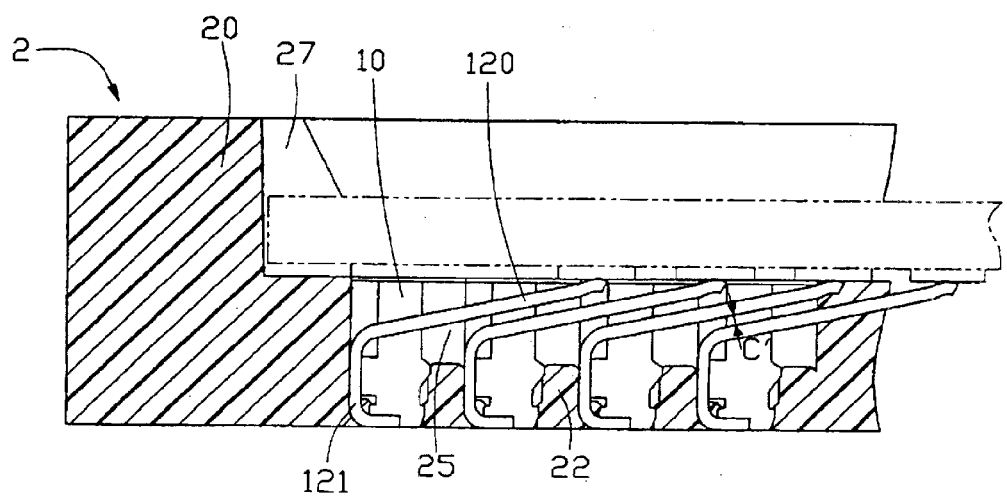
FIG. 9 is similar to FIG. 8, but showing the part of the LGA chip in a final position firmly engaged on the LGA electrical socket.

FIG. 9 shows the LGA chip 3 pressed downwardly by an external force. The electrodes 31 of the LGA chip 3 resiliently deflect the upper connecting portions 120 downwardly. When the LGA chip 3 has reached a final engaged position, the upper connecting portions 120 are still spaced from each other and substantially parallel to each other. A distance C' is defined between each two adjacent upper connecting portions 120. The distance C' is less than the distance C.

The mating beams 120 of the terminals 1 deflect under force from the LGA chip 3 from the initial position to the final position. Because of the elongated configurations of the upper connecting portions 120, they deflect uniformly and steadily under increasing application of force. That is, the LGA chip 3 can be placed on the mating portions 1200 of the upper connecting portions 120 in the initial position, and pressed downwardly with steadily increasing force to the final position to reliably establish electrical connection with the terminals 1. This enhances the performance of the LGA socket while maintaining a high density of the terminals 1 therein. That is, stable and reliable electrical connection between the LGA chip 3 and the terminals 1 is attained.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An LGA (Land Grid Array) electrical socket comprising:

a dielectric housing; and a plurality of terminals assembled in the housing in rows, each terminal comprising a locating plate for retaining the terminal in the housing, and a mating beam connected to the locating plate and extending along the corresponding row, the corresponding locating plates of the two every adjacent terminals along the corresponding row defining a first distance, from a top view, therebetween;

wherein each mating beam has an upper connecting portion extending upwardly and forwardly along the corresponding row with a second distance from said top view, said second distance being larger than the first distance; wherein from a side view, the upper connecting portion is vertically spaced from another upper connecting portion of said corresponding adjacent terminal; wherein said corresponding locating plates of said two every adjacent terminals along the corresponding row are essentially coplanar with each other; wherein each terminal comprises a bridging portion extending from the locating plate for connecting the mating beam to the locating plate, and the upper connecting portion is oriented above the bridging portion and a lower connecting portion of the corresponding mating beam is oriented below the bridging portion.

2. The electrical socket as claimed in claim 1, wherein the mating beams are parallel to and spaced apart from each other in the same row, and the upper connecting portion of each mating beam extends through and locates above the lower connecting portion of the adjacent mating beam.

3. The electrical socket as claimed in claim 2, wherein each terminal further comprises a mating portion defined on the upper connecting portion of the terminal for contacting with a corresponding electrode of an associated electronic package.

4. The electrical socket as claimed in claim 3, wherein each terminal further comprises a planar horizontal soldering base at a distal end thereof, for soldering to a circuit pad of a printed circuit board.

5. The electrical socket as claimed in claim 4, wherein the housing defines a plurality of passageways arranged in rows for accommodating the corresponding terminals.

6. The electrical socket as claimed in claim 5, wherein each passageway comprises an upper retention portion and two lower retention portions for retaining the corresponding terminal.

7. The electrical socket as claimed in claim 6, wherein each locating plate of the terminal comprises an upper barb on one side thereof for interferentially engaging with the upper retention portion, and two lower barbs on two opposite sides thereof for interferentially engaging with the two lower retention portions.

8. An LGA (Land Grid Array) electrical socket for electrically connecting an electronic package with a circuit substrate, comprising:

an insulative housing defining a plurality of passageways arranged in rows and columns, every two adjacent passageways define a first space therebetween in a first direction along said rows and a second space therebetween in a second direction along said columns; and a plurality of terminals assembled in the corresponding passageways, each terminal having a mating beam for electrically connecting to the electronic package;

wherein an upper connecting portion of the mating beam extends from one corresponding passageway and through one of said first space and second space so as to have a portion of said upper connecting portion is located over one corresponding adjacent passageway while being spaced, in a vertical direction perpendicular to said first and second directions, away from the upper connecting portion of the mating beam of the corresponding terminal disposed in said corresponding adjacent passageway without interference regardless of whether both said mating beams are in a relaxed manner or in a compressed manner.

9. The electrical socket as claimed in claim 8, wherein each terminal comprises a locating plate for retaining the terminal in the passageway.

10. The electrical socket as claimed in claim 9, wherein the mating beam is connected to a lateral edge of the locating plate.

11. The electrical socket as claimed in claim 8, wherein the upper connecting portion extends in an upward oblique direction.

12. The electrical socket as claimed in claim 11, wherein said upper connecting portion extends linearly from a top view.

13. The electrical socket as claimed in claim 12, wherein said upper connecting portion extends parallel to said rows or said columns from the top view.

14. The electrical socket as claimed in claim 8, wherein said one of the first space and second space is the first space.

15. An LGA (Land Grid Array) electrical socket for electrically connecting an electronic package with a circuit substrate, comprising;

an insulative base plate having a mating face for engaging with the electronic package, a positioning face for engaging with the circuit substrate, and a plurality of terminal-receiving passageways arranged in columns and rows and extending through the base plate from the mating face to the positioning face, and a plurality of terminals received in the terminal-receiving passageways, each of said terminals including:

a locating plate for engaging in the corresponding terminal-receiving passageway; and a mating beam extending from the locating plate of the terminal toward the mating face of the base plate; wherein said mating beam includes an upper connecting portion extending upwardly and obliquely, from a side view, and further beyond the locating plate of one neighboring terminal located in the adjacent passageway in a row direction along which, from a top view, the whole upper connecting portion roughly directs to; wherein from said side view, the upper connecting portion of the mating beam is vertically offset and spaced from another upper connecting portion of the corresponding mating beam of said neighboring terminal.

16. The electrical socket as claimed in claim 15, wherein said locating plate extends in a vertical plane parallel to said row direction.

17. The electrical socket as claimed in claim 15, wherein, from the top view, the whole upper connecting portion of the mating beam of the terminal extends straightforward along said row direction.

* * * * *

US006908313C1

(12) EX PARTE REEXAMINATION CERTIFICATE (10832nd)
United States Patent (10) Number: US 6,908,313 C1
Walkup et al. (45) Certificate Issued: Mar. 16, 2016

(54) ELECTRICAL SOCKET HAVING TERMINALS WITH ELONGATED MATING BEAMS

(75) Inventors: William B. Walkup, Hillsboro, OR (US); Fang-Jwu Liao, Tu-Chen (TW)

(73) Assignee: Hon Hai Precision Ind. Co., Ltd.

Reexamination Request:
No. 90/012,953, Aug. 30, 2013

Reexamination Certificate for:
Patent No.: 6,908,313
Issued: Jun. 21, 2005
Appl. No.: 10/964,457
Filed: Oct. 12, 2004

Related U.S. Application Data

(63) Continuation of application No. 10/625,237, filed on Jul. 22, 2003, now Pat. No. 6,805,561.

(51) Int. Cl.
*H01R 13/41* (2006.01)
*H01R 13/40* (2006.01)
*H01R 13/24* (2006.01)
*H01R 13/22* (2006.01)

(52) U.S. Cl.
CPC .... *H01R 13/2442* (2013.01); *H01L 2224/2919* (2013.01); *H01L 2924/00* (2013.01); *H01L 2924/01006* (2013.01); *H01L 2924/0665* (2013.01); *H01R 13/24* (2013.01); *H01R 13/41* (2013.01)

(58) Field of Classification Search
None
See application file for complete search history.

(56) References Cited

To view the complete listing of prior art documents cited during the proceeding for Reexamination Control Number 90/012,953, please refer to the USPTO's public Patent Application Information Retrieval (PAIR) system under the Display References tab.

*Primary Examiner* — Albert J Gagliardi

(57) ABSTRACT

An electrical socket for interconnecting an LGA chip with a PCB includes an insulative housing (2) and a multiplicity of terminals (1). The housing includes a plurality of passageways (26) extending there through for engagingly accommodating corresponding terminals. Each terminal includes a locating plate (10) arranged in rows, and a mating beam (12) connected to the locating plate and extending along the corresponding row. The terminals and the mating beams are arranged so that a projection A of each mating beam along the corresponding row is longer than a distance B between each two adjacent locating plates of two adjacent terminals arranged in the same row. Accordingly, when the mating beams are engaged with electrodes of the LGA chip, the mating beams are long enough to provide excellent resilient deflection characteristic, thereby ensuring good mechanical and electrical connection between the mating beams and the electrodes.

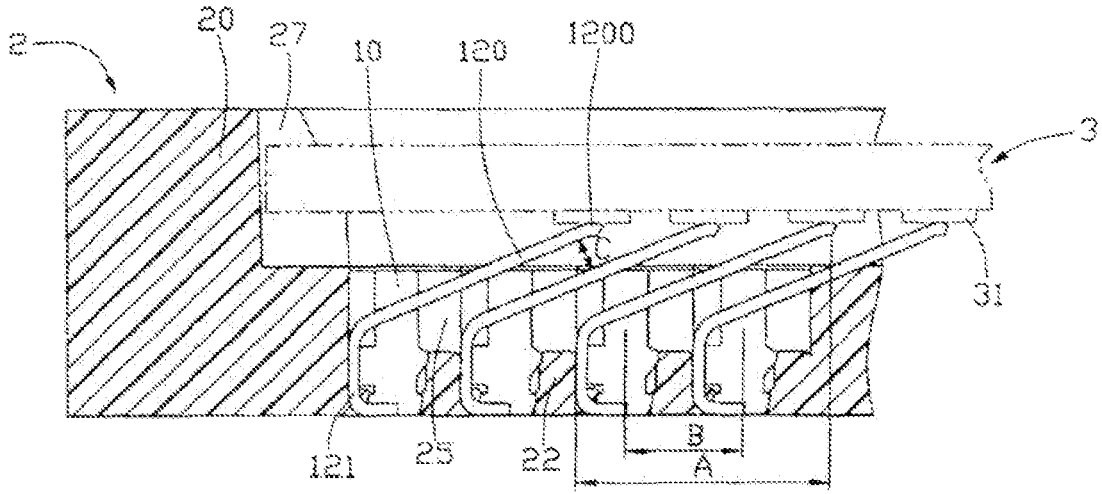

EX PARTE
REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-17 are cancelled.

\* \* \* \* \*